US011204548B2

(12) United States Patent
Sato et al.

(10) Patent No.: US 11,204,548 B2
(45) Date of Patent: Dec. 21, 2021

(54) IMPRINT APPARATUS, IMPRINTING METHOD, AND METHOD FOR MANUFACTURING ARTICLE

(71) Applicant: CANON KABUSHIKI KAISHA, Tokyo (JP)

(72) Inventors: Kazuhiro Sato, Utsunomiya (JP); Takafumi Miyaharu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 648 days.

(21) Appl. No.: 15/823,338

(22) Filed: Nov. 27, 2017

(65) Prior Publication Data
US 2018/0149969 A1 May 31, 2018

(30) Foreign Application Priority Data
Nov. 30, 2016 (JP) .............................. JP2016-233247

(51) Int. Cl.
G03F 7/00 (2006.01)
B29C 37/00 (2006.01)
B82Y 40/00 (2011.01)

(52) U.S. Cl.
CPC ........ *G03F 7/0002* (2013.01); *B29C 37/0028* (2013.01); *B29C 2037/0046* (2013.01); *B82Y 40/00* (2013.01)

(58) Field of Classification Search
CPC . G03F 7/0002; G03F 9/7042; G02B 27/0905; G02B 27/0927; G02F 2203/12; H01S 5/4012; H04N 9/3152
See application file for complete search history.

(56) References Cited

U.S. PATENT DOCUMENTS

| 2010/0102487 | A1* | 4/2010 | Schumaker | G03F 9/7049 264/408 |
| 2011/0261271 | A1* | 10/2011 | Yamagishi | H04N 9/3164 348/744 |
| 2011/0273684 | A1* | 11/2011 | Owa | B29C 43/003 355/53 |
| 2012/0328725 | A1* | 12/2012 | Minoda | B82Y 10/00 425/150 |
| 2013/0021581 | A1 | 1/2013 | Takahashi | |
| 2013/0093113 | A1* | 4/2013 | Hayashi | B82Y 10/00 264/40.1 |
| 2013/0221581 | A1 | 8/2013 | Yoneda | |
| 2015/0091199 | A1 | 4/2015 | Murakami | |

(Continued)

FOREIGN PATENT DOCUMENTS

| CN | 103048879 A | 4/2013 |
| CN | 103962079 A | 8/2014 |

(Continued)

*Primary Examiner* — Collin X Beatty
(74) *Attorney, Agent, or Firm* — Canon U.S.A., Inc. IP Division

(57) ABSTRACT

An imprint apparatus forms a pattern of an imprint material in a shot area of the substrate using the mold, and includes a heating mechanism that changes a shape of the substrate by irradiating the shot area of the substrate with light, wherein the heating mechanism includes a plurality of optical modulators that forms an illuminance distribution in the shot area of the substrate, and light beams from the plurality of optical modulators illuminate mutually different areas of the shot area.

13 Claims, 10 Drawing Sheets

(56) References Cited

U.S. PATENT DOCUMENTS

| | | | |
|---|---|---|---|
| 2016/0046045 A1 | 2/2016 | Matsumoto | |
| 2016/0297117 A1* | 10/2016 | Sato | ................... G02B 5/1861 |
| 2017/0210036 A1* | 7/2017 | Hamaya | ............... G03F 7/0002 |
| 2019/0004441 A1* | 1/2019 | Sato | ................... G03F 9/7042 |

FOREIGN PATENT DOCUMENTS

| | | |
|---|---|---|
| CN | 105917442 A | 8/2016 |
| JP | H09-109353 A | 4/1997 |
| JP | 2002-122945 A | 4/2002 |
| JP | 2003-100626 A | 4/2003 |
| JP | 2010-522977 A | 7/2010 |
| JP | 2013030757 A | 2/2013 |
| JP | 2013-089663 A | 5/2013 |
| JP | 2013-102132 A | 5/2013 |
| JP | 2013-238450 A | 11/2013 |
| JP | 2013238450 A | 11/2013 |
| JP | 2014-241396 A | 12/2014 |
| JP | 2015-5676 A | 1/2015 |
| JP | 2015-126126 A | 7/2015 |
| JP | 2016-42498 A | 3/2016 |
| KR | 20080046475 A | 5/2008 |
| KR | 10-2016-0020361 A | 2/2016 |
| KR | 10-2016-0107324 A | 9/2016 |
| WO | 2007/142350 A1 | 12/2007 |
| WO | 2015/111739 A1 | 7/2015 |

* cited by examiner

IMPRINT APPARATUS, IMPRINTING METHOD, AND METHOD FOR MANUFACTURING ARTICLE

BACKGROUND OF THE INVENTION

Field of the Invention

The aspect of the embodiments relates to an imprint apparatus, an imprinting method, and a method for manufacturing an article.

Description of the Related Art

With growing demands for microfabrication of semiconductor devices, microelectromechanical systems (MEMS), and the like, the imprint technique for molding an imprint material on a substrate using a mold to form a pattern of the imprint material on the substrate has been attracting attention, in addition to conventional photolithography technique. With the imprint technology, a pattern on the order of nanometers can be formed on a substrate. As one imprint technique, for example, photo-curing method is known. In an imprinting method using the photo-curing method, first, an imprint material is supplied onto a substrate. Next, the imprint material on the substrate and a mold are brought into contact. Then, the imprint material and the mold are irradiated with ultraviolet rays while the imprint material and the mold are in contact. After the imprint material is cured, a pattern of the imprint material is formed on the substrate by separating the mold from the cured imprint material.

The substrate on which a pattern is formed by the imprint technique may be deformed by undergoing heat processing in a film formation process by, for example, sputtering, in a series of device manufacturing processes. In such a case, the shape (including the magnification) of a pattern area, which is an area where a pattern is formed on the substrate, may change. Therefore, when an imprint material on the substrate and a mold are brought into contact in an imprint apparatus, it is necessary to match the shape of a pattern area formed on the substrate in advance (substrate-side pattern area) with the shape of a pattern area formed on the mold (mold-side pattern area). Japanese Patent Application Laid-Open No. 2013-102132 discusses an imprint apparatus that thermally deforms a substrate by heating the substrate, as a technique for matching the shape of a substrate-side pattern area with the shape of a mold-side pattern area. The imprint apparatus according to Japanese Patent Application Laid-Open No. 2013-102132 includes a light source (irradiation light source) that irradiates a substrate with light to heat the substrate and an optical modulator that adjusts the illuminance distribution of light from the light source as a mechanism for heating the substrate-side pattern area. A digital mirror device (DMD) is used for the optical modulator, for example. Using the optical modulator, the illuminance distribution of light from the light source is adjusted, and the substrate-side pattern area is irradiated therewith so that the substrate-side pattern area is deformed by absorbed heat thereof. By adjusting the illuminance distribution of light from the light source, the shape of the substrate-side pattern area can be matched with that of the mold-side pattern area.

To irradiate a substrate with light to thermally deform the substrate by absorbed heat thereof, a high-power semiconductor laser or the like is used as the light source for heating. Meanwhile, if a DMD as an optical modulator is irradiated with high-power laser light, functionality of the optical modulator may deteriorate due to an error in the inclination of a micro-mirror surface of the DMD or reduced reflectance of the mirror surface. If the functionality of the optical modulator deteriorates, the irradiation position of light in a substrate-side pattern area may be shifted or illuminance may not be as instructed, leading to lower overlay precision of the shape of the substrate-side pattern area and the shape of the mold-side pattern area.

SUMMARY OF THE INVENTION

According to an aspect of the embodiments, an imprint apparatus configured to form a pattern of an imprint material in a shot area of a substrate using a mold includes a heating mechanism configured to change a shape of the substrate by irradiating the shot area with light, wherein the heating mechanism includes a plurality of optical modulators configured to form an illuminance distribution in the shot area, and light beams from the plurality of optical modulators illuminate mutually different areas of the shot area.

Further features of the disclosure will become apparent from the following description of exemplary embodiments with reference to the attached drawings.

DESCRIPTION OF THE EMBODIMENTS

Hereinafter, exemplary embodiments of the disclosure will be described in detail with reference to the attached drawings. In each figure, the same reference numbers denote the same members and duplicate descriptions are omitted.

Figure 1:
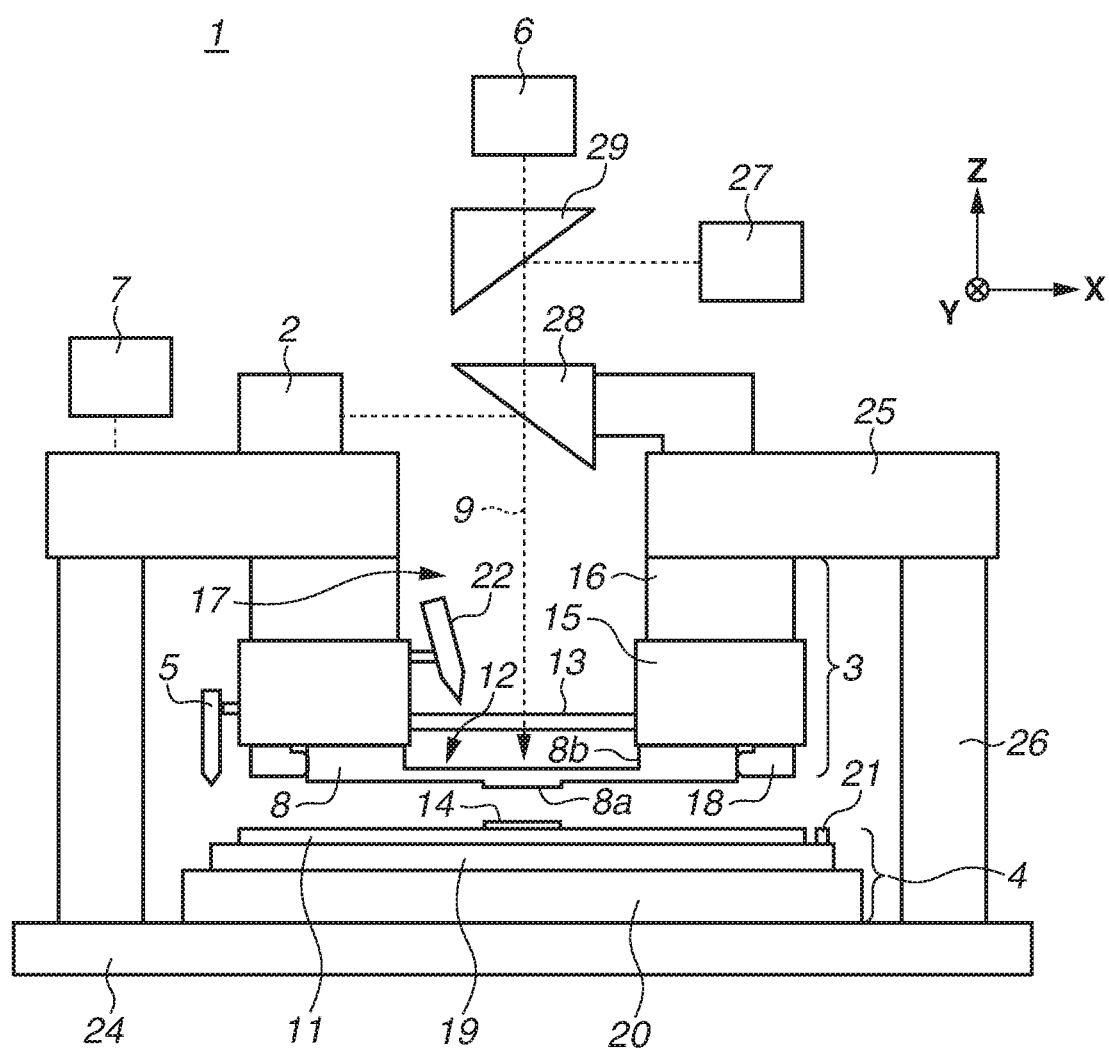
FIG. 1 is a diagram illustrating an imprint apparatus according to a first exemplary embodiment.

FIG. 1 is a diagram illustrating a configuration of an imprint apparatus 1 according to a first exemplary embodiment of the disclosure. The configuration of the imprint apparatus 1 will be described with reference to FIG. 1. Here, each axis is determined as illustrated in FIG. 1 by setting the plane on which a substrate 11 is disposed as an XY plane and the direction perpendicular to the XY plane as a Z direction. The imprint apparatus forms a pattern of a cured substance to which a concave-convex pattern of a mold is transferred, by bringing an imprint material supplied onto the substrate into contact with the mold and providing energy for curing to the imprint material. The imprint apparatus 1 in FIG. 1 is used to manufacture, as articles, devices such as semiconductor devices. Here, the imprint apparatus 1 adopting photo-curing will be described.

The imprint apparatus 1 includes an irradiation unit 2 that emits light to cure the imprint material, a mold holding mechanism 3 (mold holding unit) that holds a mold 8, a substrate stage 4 (substrate holding unit) that moves the substrate 11, and a supply unit 5 (dispenser) that supplies the imprint material onto the substrate. When the substrate is carried into the imprint apparatus 1 with the imprint material being supplied thereto in advance, the imprint apparatus 1 may not include the supply unit 5. The imprint apparatus 1 further includes a heating mechanism 6 that heats the substrate 11 to deform the substrate 11, a control unit 7 that controls an operation of each unit of the imprint apparatus 1, and a mark detection unit 22 that detects a mark formed on the mold 8 and a mark formed on the substrate 11.

The irradiation unit 2 irradiates the mold 8 with ultraviolet rays 9 from the back side of the mold 8 while the mold 8 and the imprint material are in contact. The irradiation unit 2 includes a light source (not illustrated) that emits the ultraviolet rays 9 and an optical member (not illustrated) that adjusts the ultraviolet rays 9 emitted from the light source to appropriate light. The imprint apparatus 1 according to the first exemplary embodiment adopts the photo-curing and thus is provided with the irradiation unit 2 that emits the ultraviolet rays 9. When heat curing is adopted, on the other hand, thermosetting resin is used as the imprint material and, instead of the irradiation unit 2, a heat source unit to cure the thermosetting resin is provided.

The mold 8 has a square (rectangular) outer peripheral shape and includes a pattern portion 8a where a circuit pattern to be transferred to an imprint material on the substrate 11 is formed. The material of the mold 8 is a material such as quartz that can transmit the ultraviolet rays 9. Further, the surface of the mold 8 irradiated with the ultraviolet rays 9 may have a shape with a concave portion (cavity 8b) to facilitate deformation of the pattern portion 8a of the mold 8 in a convex form with respect to the substrate 11. In addition, a light transmission member 13 is disposed in the opening area 17 inside the mold holding mechanism 3 so that a space 12, which is an enclosed space, is formed by a portion of an opening area 17, the cavity 8b, and the light transmission member 13. Accordingly, the mold 8 can be deformed in a convex form by controlling the pressure inside the space 12 using a pressure control apparatus (not illustrated).

A curing composition (also called uncured resin) that is cured by receiving energy for curing is used for an imprint material 14. As energy for curing, electromagnetic waves, heat, and the like is used. Examples of electromagnetic waves include light such as infrared rays, visible rays, and ultraviolet rays with a wavelength selected from the range of 10 nm to 1 mm.

The curing composition is a composition cured by irradiation of light or heating. Among such curing compositions, photo-curing compositions cured by light contain at least a polymerizable compound and a photo-polymerization initiator and may also contain a non-polymerizable compound or a solvent if necessary. The non-polymerizable compound is at least one compound selected from the group including sensitizers, hydrogen donors, internal mold releasing agents, surfactants, antioxidants, polymer components, and the like.

The imprint material 14 is applied onto the substrate in the form of a film by a spin coater or a slit coater. Alternatively, the imprint material 14 may be imparted onto the substrate by a liquid injection head in the form of droplets or an island or film formed by a plurality of droplets being combined. The viscosity (viscosity at 25° C.) of the imprint material is, for example, 1 mPa·s or more and 100 mPa·s or less.

Glass, ceramics, metal, semiconductors, resin, or the like is used for the substrate 11. A member made of a different material from the substrate 11 may be formed on the surface of the substrate 11 if necessary. More specifically, the substrate 11 is a silicon wafer, a compound semiconductor wafer, quartz glass, and the like.

The mold holding mechanism 3 includes a mold chuck 15 that holds the mold 8 by a vacuum suction force or electrostatic force and a mold driving unit 16 that holds the mold chuck 15 to move the mold 8 (mold chuck 15). The mold chuck 15 and the mold driving unit 16 have the opening area 17 in a central portion (on the inner side) thereof so that the ultraviolet rays 9 emitted from the light source of the irradiation unit 2 are emitted toward the substrate 11. The mold holding mechanism 3 further includes a mold deformation mechanism 18 that deforms the mold 8 (pattern portion 8a) by providing an external force to the side face of the mold 8. By deforming the mold 8, the mold deformation mechanism 18 can match the shape of the pattern portion 8a (mold-side pattern area) with the shape of the substrate-side pattern area formed on the substrate 11 in advance.

The mold driving unit 16 moves the mold 8 in the Z-axis direction to bring the mold 8 into contact with the imprint material 14 on the substrate 11 (mold pressing) or to separate the mold 8 from the imprint material 14 that has cured (mold releasing). As an actuator that can be adopted for the mold driving unit 16, for example, a linear motor and an air cylinder are available. The mold driving unit 16 may include a plurality of driving systems, such as a coarse motion driving system and a fine motion driving system, to position the mold 8 with high precision. Further, the mold driving unit 16 may have a positioning function not only in the Z-axis direction, but also in the X-axis direction, the Y-axis direction, or the θ (rotation about the Z-axis) direction or a tilt function to correct the inclination of the mold 8. Each operation of mold pressing and mold releasing by the imprint apparatus 1 may be implemented by, as described above, moving the mold 8 in the Z-axis direction, but may also be implemented by moving the substrate stage 4 in the Z-axis direction. Alternatively, each operation of mold pressing and mold releasing may be implemented by relatively or sequentially moving both of the mold holding mechanism 3 (mold 8) and the substrate stage 4 (substrate 11).

The substrate stage 4 is a substrate holding unit that holds the substrate 11. When the mold 8 and the imprint material 14 on the substrate 11 come into contact, the substrate stage 4 performs alignment between the mold 8 and the substrate 11. The substrate stage 4 includes a substrate chuck 19 that holds the substrate 11 by a vacuum suction force or electrostatic force and a stage driving unit 20 that holds the substrate chuck 19 to move the substrate 11 (substrate chuck 19) in the XY plane. The substrate stage 4 also has a reference mark 21 used when the mold 8 is aligned. The stage driving unit 20 may adopt, for example, a linear motor as an actuator. The stage driving unit 20 may also include a plurality of driving systems, such as a coarse motion driving system and a fine motion driving system, in each of the X-axis and Y-axis directions. The stage driving unit 20 may further have a driving system for positioning in the Z-axis direction, a positioning function of the substrate 11 in the θ direction, or a tilt function to correct the inclination of the substrate 11.

The supply unit 5 (dispenser) supplies (applies) the imprint material 14 onto the substrate 11. The amount of the imprint material 14 discharged from a discharge port (discharge nozzle) of the supply unit 5 is appropriately determined based on the thickness of a pattern of the imprint material 14 to be formed on the substrate 11, the density of a pattern of the imprint material 14 to be formed, and the like.

The imprint apparatus 1 may include a filling monitor 27. Though not illustrated, the filling monitor 27 includes a light source, an image sensor, and an optical system and captures an image of contact of the imprint material 14 with the pattern portion 8a when the mold 8 and the imprint material 14 on the substrate 11 come into contact. By capturing an image of a contact state of the mold 8 and the imprint material 14 on the substrate 11 by the image sensor through the filling monitor 27, a foreign substance sandwiched between the mold 8 and the substrate 11 can be detected. Further, by capturing an image of the contact state through the filling monitor 27, the imprint apparatus 1 can identify an unfilled location of the imprint material 14 or detect a relative inclination between the mold 8 and the substrate 11.

The control unit 7 can control the operation (adjustment) of each component of the imprint apparatus 1. The control unit 7 includes, for example, a computer and is connected to each component of the imprint apparatus 1 via a line to be able to control each component according to a program or the like. The control unit 7 may be configured integrally with the imprint apparatus 1 (in a common housing) or separately from other parts of the imprint apparatus 1 (in a separate housing).

The imprint apparatus 1 includes a mark detection unit 22 that detects a mark formed on the mold 8 or the substrate 11. For example, the mark detection unit 22 measures a positional shift of the mold 8 and the substrate 11 in the X-axis and Y-axis directions or a difference in shape between the mold-side pattern area and the substrate-side pattern area by detecting an alignment mark formed on the substrate 11 and an alignment mark formed on the mold 8. The mark detection unit 22 may be disposed in the opening area 17 or at a location apart from the mold 8 and the substrate 11 via a relay optical system.

The imprint apparatus 1 includes a base table 24 on which the substrate stage 4 is placed, a bridge table 25 to which the mold holding mechanism 3 is fixed, and a column 26 extended from the base table 24 to support the bridge table 25. The imprint apparatus 1 may further include a mold conveyance mechanism (not illustrated) that carries the mold 8 into the mold holding mechanism 3 from outside the imprint apparatus 1 or carries the mold 8 out of the imprint apparatus 1. The imprint apparatus 1 may also include a substrate conveyance mechanism (not illustrated) that carries the substrate 11 onto the substrate stage 4 from outside the imprint apparatus 1 or carries the substrate 11 out of the imprint apparatus 1.

The heating mechanism 6 heats the substrate 11 to change (correct) the shape of the substrate-side pattern area formed on the substrate 11 held by the substrate stage 4. The heating mechanism 6 may adopt, for example, as illustrated in FIG. 1, a heating light source (i.e., light source for heating) that heats the substrate 11 by emitting light toward the substrate 11 through the mold 8. The heating mechanism 6 also includes, in addition to the heating light source, an optical modulator and an optical system to adjust light emitted from the heating light source into light appropriate for heating the substrate-side pattern area. An optical element 28 (for example, a dichroic mirror) that reflects the ultraviolet rays 9 emitted from the irradiation unit 2 and transmits light from the heating light source is disposed on an optical path of light from the heating light source. On the optical path of heating light, an optical element 29 that reflects light emitted from the light source of the filling monitor 27 and transmits light from the heating light source is further disposed.

More specifically, a digital micro-mirror device (DMD), a liquid crystal display (LCD) or the like is used for the optical modulator (illuminance distribution forming unit). In the first exemplary embodiment, a case where a DMD is used as the optical modulator will be described. A DMD is a reflective optical modulator that reflects emitted light, in which a few hundred thousand (e.g., 1024×768) micro-mirrors that can individually be controlled and measure ten and several µm per side are arranged. Each micro-mirror is mechanically controlled by a digital signal and tilts at an angle of, for example, +12 degrees (ON state) or −12 degrees (OFF state) with respect to a mirror arrangement plane 66. The heating mechanism 6 includes a dose control apparatus for controlling the DMD. By controlling the DMD using the dose control apparatus, an illuminance distribution of light from the heating light source can be formed for the substrate-side pattern area to obtain a target correction amount.

A high-power light source is used to thermally deform the substrate 11 (substrate-side pattern area) by absorption heat of light from the heating mechanism 6 and is, for example, a semiconductor laser. The substrate 11 also is to be held by the substrate chuck 19 using a suction force. When the suction force increases, a force acting in a direction perpendicular to the substrate surface increases and also a frictional force between the substrate 11 and the substrate chuck 19 acting in a direction parallel to the substrate surface increases. Accordingly, a larger amount of absorption heat is used to deform the substrate-side pattern area into a target shape.

Meanwhile, when high-power laser light is emitted toward the DMD, the micro-mirror is more likely to deteriorate and an error of inclination of the mirror surface occurs or the reflectance of the mirror surface decreases. Due to deterioration of the micro-mirror, the irradiation position in the substrate-side pattern area may be shifted or a target illuminance distribution may not be obtained, leading to lower overlay precision of the shape of the substrate-side pattern area and the shape of the mold-side pattern area.

Thus, the heating mechanism 6 according to the first exemplary embodiment forms a target illuminance distribution for the substrate-side pattern area using a plurality of optical modulators (DMDs). The heating mechanism 6 according to the first exemplary embodiment will be described with reference to FIGS. 4 and 5. The heating mechanism 6 illustrated in FIG. 4 includes a dose control apparatus 61, a plurality of heating light sources (62A, 62B), a plurality of DMDs 63 (63A, 63B), a projection optical system 64, and irradiation optical systems 65 (65A, 65B).

A high-power semiconductor laser or the like is used as the heating light source 62 to deform the substrate-side pattern area and is condensed by optical fibers. The light emitted from the heating light source 62 is light (for example, visible light or near-infrared light) absorbed by the substrate 11 and having a wavelength in a wavelength band where the imprint material on the substrate 11 is not cured.

The irradiation optical system 65 includes a condenser optical system (not illustrated) that condenses light emitted from the heating light source 62 and a uniform illumination optical system (not illustrated) for illuminating the DMD 63 after making the intensity of light from the condenser optical system uniform. The uniform illumination optical system may include an optical element such as a micro-lens array (MLA).

Figure 6A:
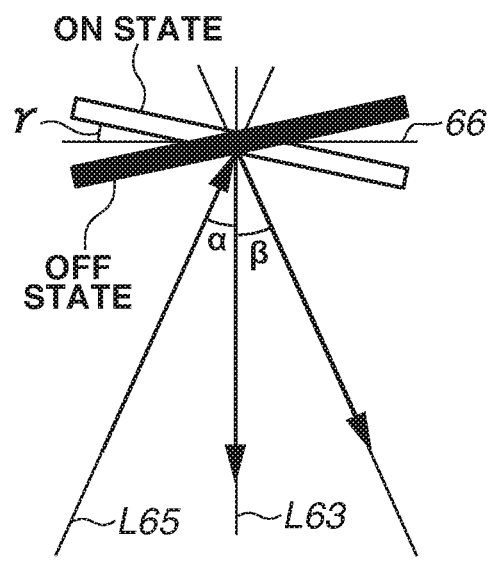
FIGS. 6A, 6B, and 6C are diagrams illustrating a method for tilting a micro-mirror included in an optical modulator.

The light whose intensity is made uniform by the irradiation optical system 65 illuminates the DMD 63. Each micro-mirror included in the DMD 63 as an optical modulator tilts, as illustrated in FIG. 6A, at an angle of −12 degrees (OFF state) or +12 degrees (ON state) with respect to the mirror arrangement plane 66. Here, if, relative to the mirror arrangement plane 66, the incident angle on the DMD 63 is α, the emission angle from the DMD 63 is β, and the inclination of the micro-mirror is γ, the emission angle β is represented as β=2γ−α. It is assumed here that the clockwise direction with respect to the arrangement plane is negative and the counterclockwise direction is positive. Normally, light reflected by the micro-mirror in the ON state is emitted in a direction perpendicular to the mirror arrangement plane 66 (β=0 degree) and thus the incident angle α of light illuminating the DMD 63 is set to 24 degrees. If the DMD 63 is irradiated with light, the reflected light is reflected in different directions depending on the ON state or the OFF state. An illuminance distribution can be formed depending on whether the reflected light is incident in the numerical aperture (NA) of the projection optical system 64 disposed downstream of the DMD 63. Light reflected by the micro-mirror in the ON state of the DMD 63 forms an image on the substrate 11 by the projection optical system 64. Here, the DMD 63 and the substrate 11 are in an optically conjugate relationship. The dose control apparatus 61 controls the DMD 63 such that a target illuminance distribution is formed in the substrate-side pattern area.

Figure 3A:
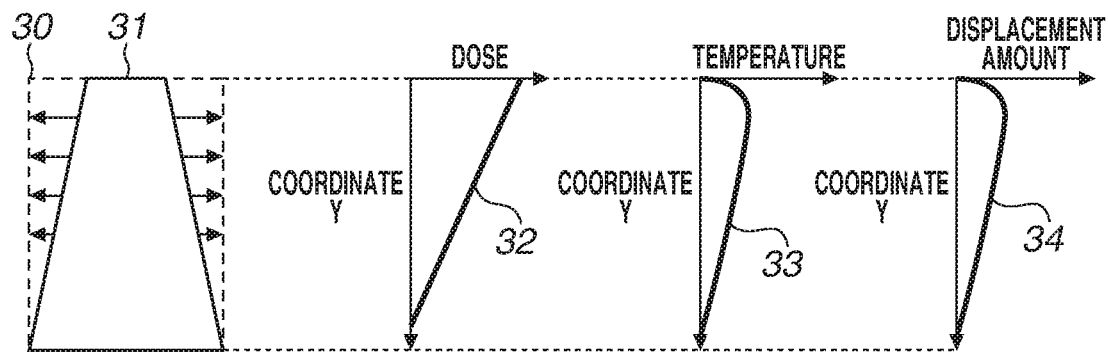
FIGS. 3A and 3B are diagrams illustrating a relationship between an illuminance distribution, a temperature distribution, and a displacement amount on a substrate.
Figure 3A:
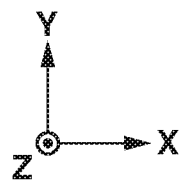

Here, a case where, as illustrated in FIG. 3A, the shape of a substrate-side pattern area 31 containing a shape difference of a trapezoidal component in the Y direction is corrected will be described. In this case, the light for heating the substrate 11 forms, as illustrated in FIG. 3A, an illuminance distribution 32 in the Y direction and the dose is made uniform in the X direction. The light having the illuminance distribution 32 is generated by the dose control apparatus 61 and the substrate 11 is irradiated therewith.

Figure 3B:
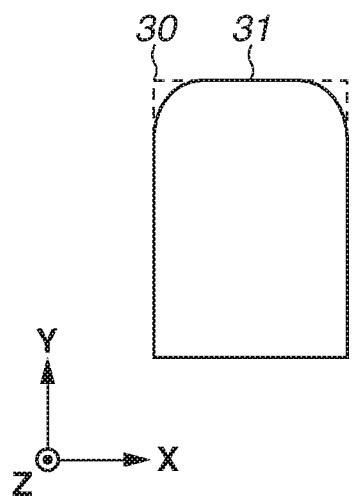

When light is emitted from the heating light source 62 as described above, a temperature distribution 33 illustrated in FIG. 3A is formed in the substrate-side pattern area 31. Due to the temperature distribution 33 formed, the substrate-side pattern area 31 is thermally deformed by a displacement amount 34 illustrated in FIG. 3A. As a result, the shape of the substrate-side pattern area 31 can be corrected as illustrated in FIG. 3B. Thus, by deforming (correcting) the substrate-side pattern area 31, the heating mechanism 6 can match the shape of the substrate-side pattern area 31 with the shape of a mold-side pattern area 30 in which a pattern is formed on the mold 8. In addition to the correction by thermal deformation described above, the mold-side pattern area may be deformed by applying a force to the mold 8.

In the substrate-side pattern area according to the first exemplary embodiment, it is assumed that a shape difference of a trapezoidal component is contained, but the disclosure is not limited to such an example and a shape difference of other components may be contained or a shape difference of a different component may be contained for each of a plurality of substrate-side pattern areas. When, for example, the substrate-side pattern area containing a shape difference of a magnification component is corrected by the heating mechanism 6 through thermal deformation, the DMD should at least be controlled by the dose control apparatus such that a uniform temperature distribution is formed in the substrate-side pattern area 31.

Figure 4:
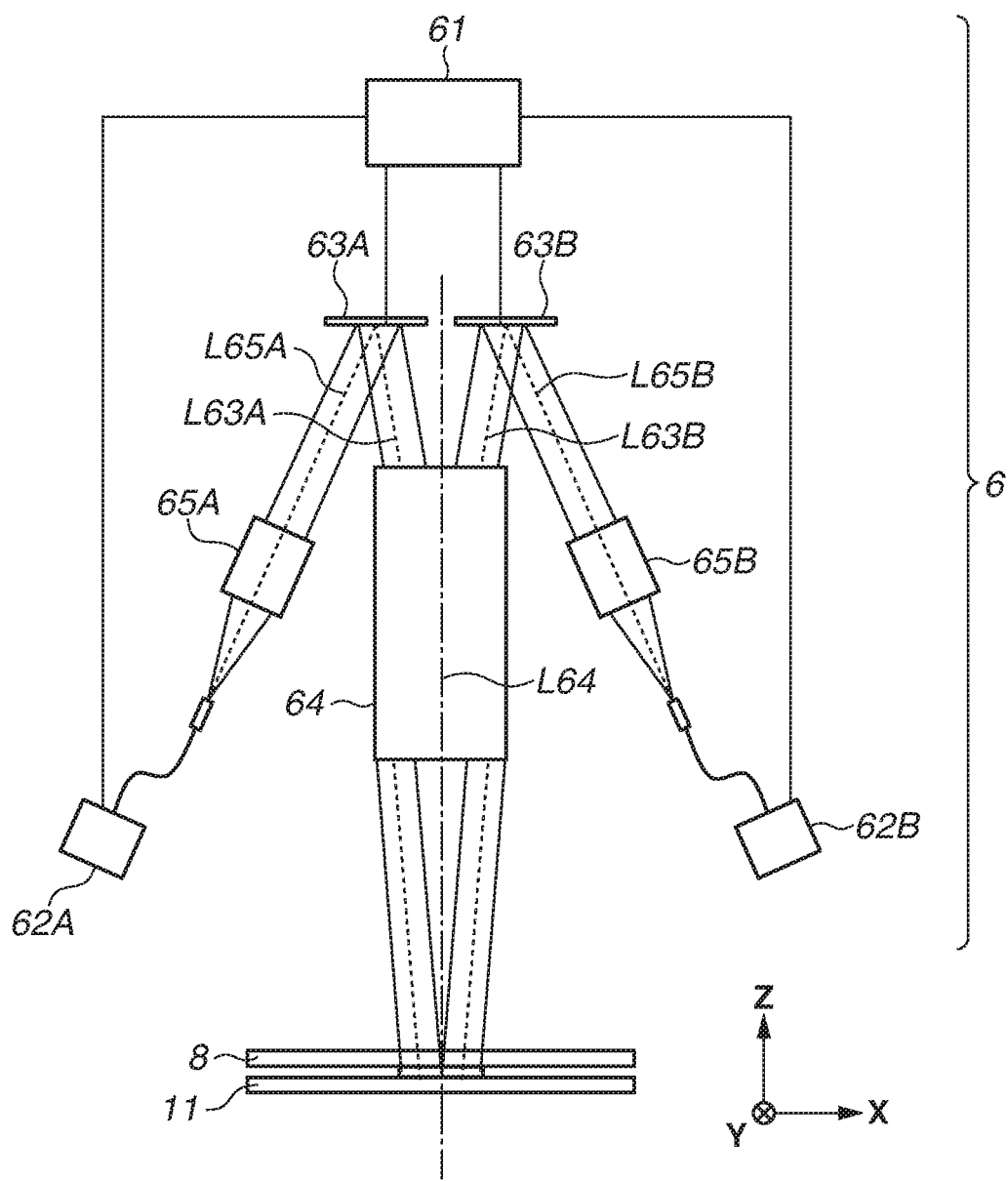
FIG. 4 is a diagram illustrating a heating mechanism according to the first exemplary embodiment.

The first exemplary embodiment includes, as illustrated in FIG. 4, two each of the heating light source 62, the DMD 63, and the irradiation optical system 65. Here, the substrate-side pattern area is heated by a heater A including the heating light source 62A, the irradiation optical system 65A, and the DMD 63A and a heater B including the heating light source 62B, the irradiation optical system 65B, and the DMD 63B. Light beams emitted from the heater A and the heater B heat the substrate-side pattern area via the projection optical system 64 common to both. In the first exemplary embodiment, it is assumed that a plurality of units of the heating light source 62 is provided, but the disclosure is not limited to such an example and light emitted from a single unit of the heating light source 62 may be split by a beam splitter (optical element).

Next, the method for separately illuminating the substrate-side pattern area using the heater A and the heater B will be described. As illustrated in FIG. 4, the heater A and the heater B are disposed rotation-symmetrically with respect to an optical axis L64 of the projection optical system 64, and the DMD 63 is disposed by being shifted with respect to the optical axis L64 of the projection optical system 64. Light reflected (modulated) by the DMD 63A and light reflected (modulated) by the DMD 63B illuminate the substrate-side pattern area via the projection optical system 64 common to both. If the size of the substrate-side pattern area is, for example, 26×33 mm, each of the DMDs 63 is controlled by the dose control apparatus 61 such that the illumination light on a pattern of the substrate 11 has a size of 26×16.5 mm. If the imaging magnification of the projection optical system 64 is assumed to be −3, an area of 8.67×5.5 mm becomes an operating area on the DMD 63 and other areas become a non-operating area.

Here, if an attempt is made to dispose the DMD 63A and the DMD 63B next to each other, the micro-mirrors cannot be disposed next to each other due to packages protecting the micro-mirrors of the DMDs 63. More specifically, there will be a gap between illumination light beams controlled to a target shape (for example, 26×16.5 mm) by the DMD 63A and the DMD 63B, and as a result, the substrate-side pattern area cannot be sufficiently corrected. Therefore, in the first exemplary embodiment, an optical axis L63A and an optical axis L63B of respective light beams reflected by the DMD 63A and the DMD 63B are set to be shifted and tilted with respect to the optical axis L64 of the projection optical system 64.

It is assumed that, for example, the DMD 63A and the DMD 63B are disposed in the same plane perpendicular to the optical axis L64 of the projection optical system 64 and separated by packages of the DMDs 63, the interval between operating areas is 30 mm, and the imaging magnification of the projection optical system 64 is −3. The distance of illumination light beams from the heating light sources on the substrate 11 becomes 10 mm. The method for determining the tilt amounts of the optical axis L63A and the optical axis L63B of light reflected by the DMDs 63 based on the shift amount determined as described above will be described.

Figure 5:
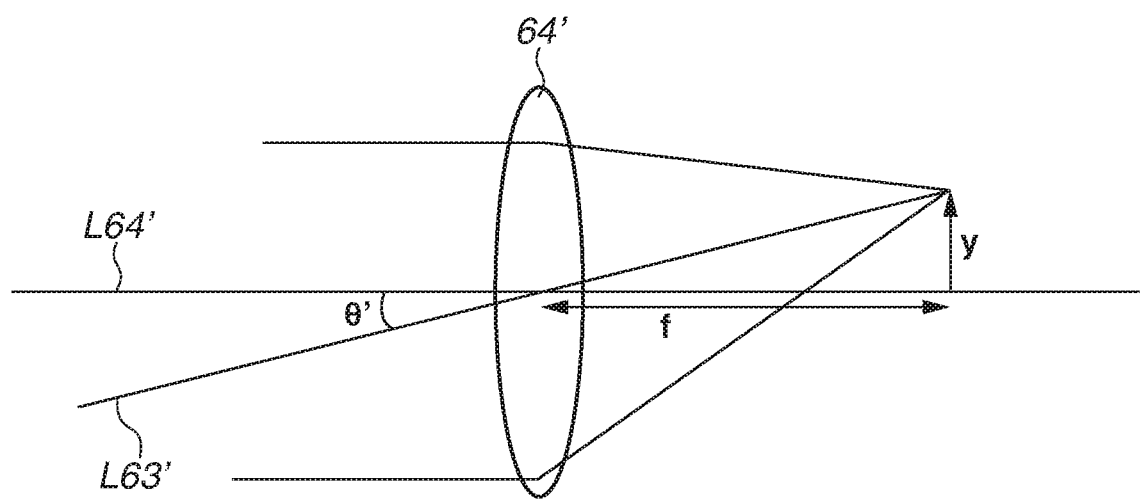
FIG. 5 is a diagram illustrating a method for determining a tilt amount.

First, the method for determining the tilt amount of the optical axis based on the distance (shift amount) of illumination light beams incident on the substrate 11 from the heating light sources will be described with reference to FIG. 5. An image height y on an image plane is represented as y=f*tan θ' using an off-axis ray L63' which is incident at an angle of θ' with respect to an axis L64' passing through a principal point and the center of an optical system 64' having a focal length f. Here, y can be considered as a shift amount on the image plane when the off-axis ray L63' is used as an optical axis. That is, when the illumination area is to be shifted by y in the substrate-side pattern area, the angle β of the optical axis of light reflected by the DMD 63 with respect to the optical axis of the projection optical system is only be tilted by $\beta=\tan^{-1}(y/f)$.

Figure 6B:
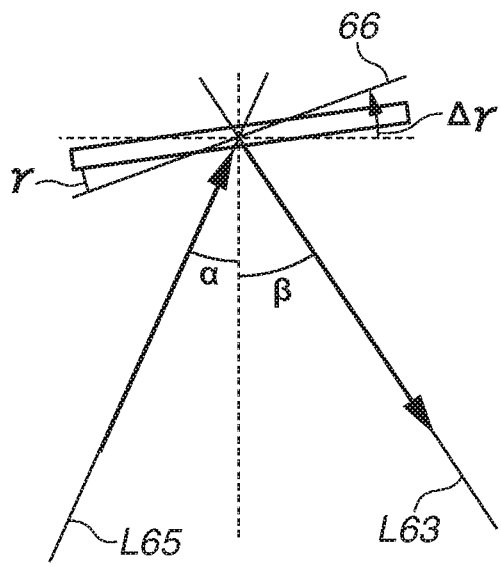
Figure 6C:
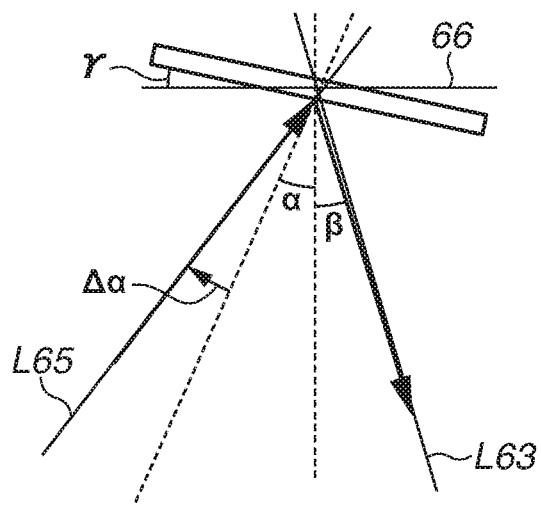

Next, the method for tilting an optical axis L63 of light reflected by the DMD 63 with respect to the optical axis of the illumination optical system will be described with reference to FIGS. 6B and 6C. FIGS. 6B and 6C illustrate a micro-mirror in the ON state. As illustrated in FIG. 6B, the optical axis of light reflected by the DMD 63 can be tilted by tilting, by a predetermined angle, the mirror arrangement plane 66 of the DMD 63A and the DMD 63B with respect to a plane perpendicular to the optical axis L64 of the projection optical system 64. When the mirror arrangement plane 66 is tilted by an angle of, for example, Δγ, Δγ is represented as $\Delta\gamma=(\beta+\alpha)/2-\gamma$. That is, the angle Δγ by which the mirror arrangement plane 66 is tilted can be determined from the angle (emission angle) β of the optical axis of light reflected by the DMD 63 determined as described above.

Also, another method for tilting the optical axis L63 of light reflected by the DMD 63 with respect to the optical axis L64 of the projection optical system 64 will be described with reference to FIG. 6C. As illustrated in FIG. 6C, the optical axis of light reflected by the DMD 63 can be tilted with respect to the optical axis L64 of the projection optical system 64 by tilting an optical axis L65 of light emitted from the irradiation optical system 65 while the mirror arrangement plane 66 remains perpendicular to the optical axis L64 of the projection optical system 64. If the incident angle α (angle of the optical axis L65 of light from the irradiation optical system 65 with respect to the optical axis L64 of the projection optical system 64) of light from the irradiation optical system 65 is tilted by Δα, the angle Δα is represented as $\Delta\alpha=\alpha+\beta-2\gamma$.

By decentering the optical axis L63 of light reflected by the DMD 63 with respect to the optical axis L64 of the projection optical system 64 as described above to make the optical system of the heating mechanism 6 a decentered optical system, the substrate-side pattern area can be separately illuminated using light beams reflected by the DMD 63A and the DMD 63B. Thus, light beams from a plurality of optical modulators can illuminate mutually different areas of the substrate-side pattern area.

Subsequently, the method for adjusting illumination light illuminating the substrate-side pattern area by the heating mechanism 6 will be described. Illumination light illuminating the substrate-side pattern area is adjusted by controlling micro-mirrors of the respective operating areas of the DMD 63A and the DMD 63B corresponding to the size of the substrate-side pattern area. When the substrate-side pattern area is separately illuminated by the heating mechanism 6, reflected light in the substrate-side pattern area is observed by an image sensor of the filling monitor 27. Based on observation results by the image sensor, the position and inclination of the DMD 63 and the range of operating areas are adjusted. By adjusting the position and inclination of the DMD 63 as described above, shifts and inclinations of the optical axis L63 of light reflected by the DMD 63 with respect to the optical axis L64 of the projection optical system 64 can be adjusted. The DMD 63 is provided with a tilt stage or a shift stage (not illustrated) to change the position or inclination thereof. Instead of changing the position of the DMD 63 using the shift stage, the illumination light may be shifted (the optical axis L63 may be shifted) by shifting the operating area of the DMD 63. In that case, the area in which micro-mirrors of the DMD 63 are formed is wider than the operating area.

The heating mechanism 6 according to the first exemplary embodiment has been described assuming that two each of the heating light source 62, the DMD 63, and the irradiation optical system 65 are provided, but the disclosure is not limited to such an example and there may be three heaters or more.

(Imprint Process)

Figure 2:
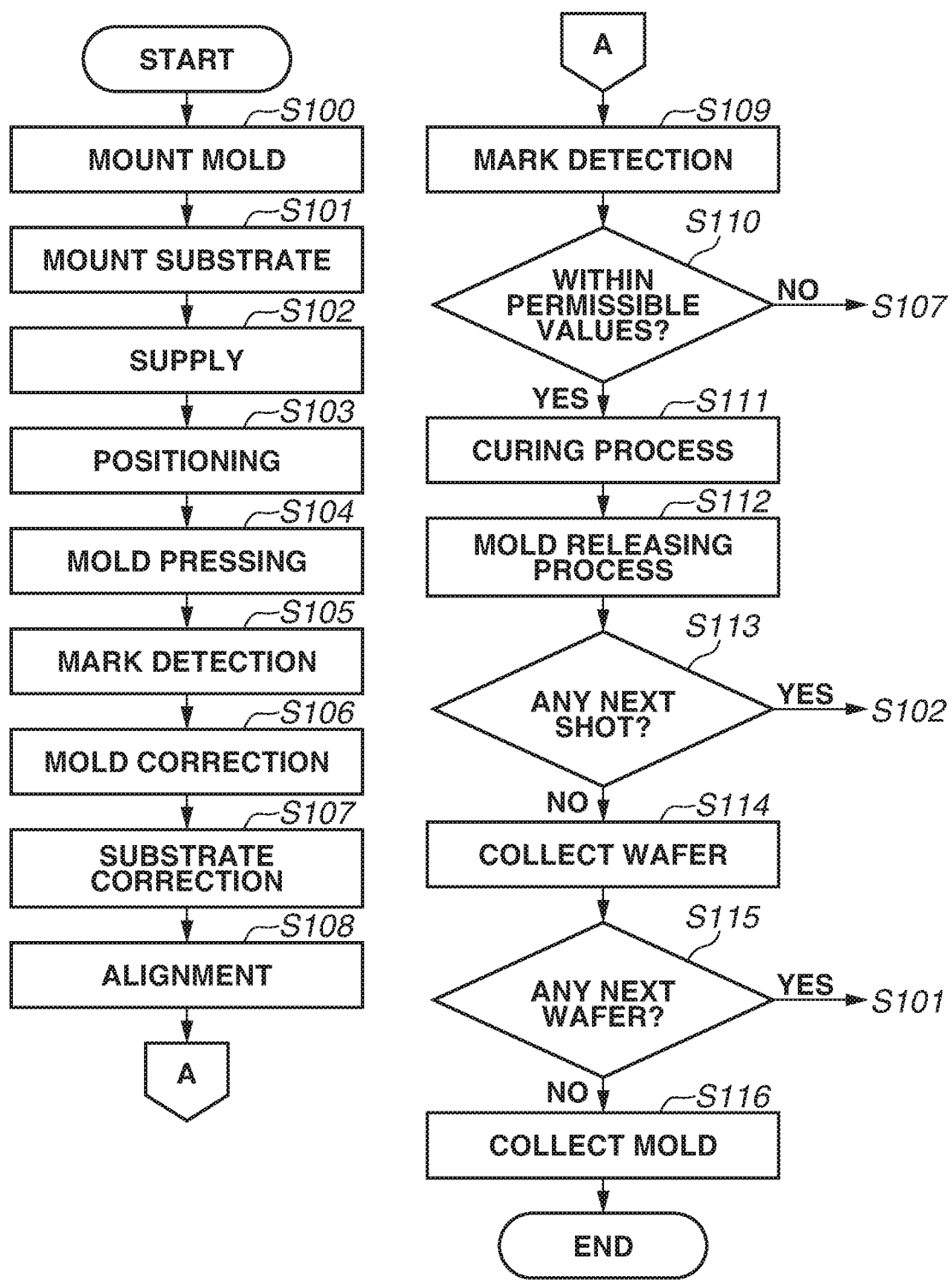
FIG. 2 is a flowchart illustrating an imprinting method.

Next, an imprint process by the imprint apparatus 1 will be described with reference to FIG. 2. FIG. 2 is a flowchart illustrating an operation sequence of the imprint process that forms a pattern of an imprint material in a plurality of substrate-side pattern areas (shot areas) on a plurality of the substrates 11 by the imprint apparatus 1 using the mold 8 for the substrates 11. The operation of the imprint process is performed by the control unit 7.

When an operation sequence is started, in step S100, the control unit 7 causes the mold conveyance mechanism to mount the mold 8 on the mold chuck 15. In step S101, the control unit 7 causes the substrate conveyance mechanism to mount the substrate 11 on the substrate chuck 19. The order in which the mold 8 and the substrate 11 are carried into the imprint apparatus is not particularly limited, and the mold 8 and the substrate 11 may be carried in sequentially or simultaneously.

In step S102, the control unit 7 moves the substrate-side pattern area of the substrate 11 to the supply position of the supply unit 5 by the substrate stage 4, and then causes the supply unit 5 to supply (apply) the imprint material 14 onto the substrate 11 as a supply process. Then, in step S103, the control unit 7 moves the substrate 11 to a predetermined position by the substrate stage 4 and moves the substrate 11, to which the imprint material 14 has been supplied, to a position (mold pressing position) below the mold 8 to position the substrate 11 with respect to the mold 8.

In step S104, the control unit 7 operates the mold driving unit 16 as a mold pressing process and brings the mold 8 and the imprint material 14 supplied to the substrate-side pattern area into contact. How the imprint material 14 is brought into contact with the mold 8 (how the mold 8 is filled) can be observed through the filling monitor 27. Then, in step S105, the mark detection unit 22 detects light from an alignment mark formed on the mold 8 and an alignment mark formed on the substrate 11 while the mold 8 and the imprint material 14 are in contact. Based on detection results of the alignment marks detected by the mark detection unit 22, positional shifts of the mold 8 and the substrate 11 in the X-axis direction, the Y-axis direction, and the θ direction are measured. Further, based on the measured positional shift amounts of the alignment marks, a difference between the shape of the mold-side pattern area and the shape of the substrate-side pattern area can be measured. Further, a correction amount of the shape of the mold-side pattern area of the mold 8 and a correction amount of the shape of the substrate-side pattern area of the substrate 11 are each determined so that the difference in shape decreases.

In step S106, as a mold correction process, the control unit 7 causes the mold deformation mechanism 18 to deform the mold 8 based on the correction amount of the shape of the mold-side pattern area of the mold 8 determined in step S105. Accordingly, the control unit 7 can correct the shape of the mold-side pattern area of the mold 8 into a target shape. In step S107, as a substrate correction process, the control unit 7 further heats the substrate 11 by the heating mechanism 6 to deform the substrate 11 by providing a temperature distribution to the substrate-side pattern area based on the correction amount of the shape of the substrate-side pattern area of the substrate 11 determined in step S105.

Accordingly, the control unit 7 can thermally correct the shape of the substrate-side pattern area of the substrate 11 into a target shape.

The method for forming a temperature distribution in step S107 will now be described. A heating light source that emits light (for example, near-infrared light) of a wavelength at which imprint materials are not cured is used for the heating mechanism 6 to heat the substrate 11. Light emitted from the heating light source passes through the DMD and the mold 8 and then irradiates the substrate-side pattern area of the substrate 11. By controlling the dose of light emitted from the heating light source by a large number of mirrors included in the DMD, an illuminance distribution can be formed in an irradiation plane on the substrate 11. Based on the illuminance distribution, any temperature distribution can be formed on the substrate 11. The correction amount of the shape of the substrate-side pattern area can be determined from the detection results of alignment marks in step S105. Based on the correction amount determined from the detection results of alignment marks, the control unit 7 determines the temperature distribution or illuminance distribution needed to correct the shape of the substrate-side pattern area. Then, the dose control apparatus controls the heating mechanism 6 such that the obtained temperature distribution or illuminance distribution is formed on the substrate. The substrate-side pattern area of the substrate 11 is deformed by a manufacturing process of semiconductors. The deformation of the substrate-side pattern area is roughly divided into deformation of magnification components, parallelogram components, and trapezoidal components and these components are frequently combined. To correct each deformation component, the temperature distribution may be formed not only inside of the substrate-side pattern area but also outside the area.

Next, the control unit 7 drives the stage driving unit 20 to correct positional shifts of the substrate-side pattern area and the mold-side pattern area determined in step S105. Accordingly, in step S108, the mold 8 and the substrate 11 can be relatively aligned.

After the mold 8 and the substrate 11 are aligned in step S108, in step S109, the mark detection unit 22 detects an alignment mark formed on the mold 8 and an alignment mark formed on the substrate 11. Based on the result of the detected alignment marks, the control unit 7 can determine positional shifts and shape differences between the mold-side pattern area and the substrate-side pattern area in the X, Y, and θ directions. Then, based on the measured positional shifts or shape differences, a correction amount of the shape of the substrate-side pattern area and the mold-side pattern area may be calculated so that the shape of the mold-side pattern area and the shape of the substrate-side pattern area coincide.

Then, in step S110, the control unit 7 determines whether the calculated positional shifts and shape differences (correction residuals) between the mold-side pattern area and the substrate-side pattern area are within permissible values. If the control unit 7 determines in step S110 that the calculated values are not within the permissible values (NO in step S110), the control unit 7 can correct the position or shape of the substrate with the processing returning to step S107. On the other hand, if the control unit 7 determines in step S110 that the calculated values are within the permissible values (YES in step S110), the processing proceeds to next step S111. Further, the control unit 7 may make a determination in step S110 based on relative positional shift amounts of the mold and the substrate. Also, if the control unit 7 determines in step S110 that the calculated values are not within the permissible values (NO in step S110), the control unit 7 may correct the position or shape of the mold with the processing returning to step S106.

In step S111, after performing alignment of the mold 8 and the substrate 11, the control unit 7 causes the irradiation unit 2 to irradiate the imprint material supplied onto the substrate 11 with the ultraviolet rays 9 to cure the imprint material (curing process). In step S112, after the imprint material is cured, the control unit 7 drives the mold driving unit 16 to separate the mold 8 from the cured imprint material on the substrate by broadening the distance between the mold and the substrate (mold releasing process).

Subsequently, in step S113, the control unit 7 determines whether there is still a substrate-side pattern area on the same substrate 11 in which a pattern of the imprint material 14 should be formed. Here, if the control unit 7 determines that there is a substrate-side shot area in which a pattern should be formed (YES in step S113), the processing returns to step S102 to supply an imprint material to the next substrate-side shot area. On the other hand, if the control unit 7 determines that there is no substrate-side shot area in which a pattern should be formed (NO in step S113), the processing proceeds to next step S114. In step S114, the control unit 7 causes the substrate conveyance mechanism to collect the substrate 11 held on the substrate chuck 19.

Next, in step S115, the control unit 7 continues to determine whether there is still a substrate on which a similar imprint process should be performed. Here, if the control unit 7 determines that there is still a substrate on which the imprint process should be performed (YES in step S115), the processing returns to step S101 to carry the next substrate into the imprint apparatus by the substrate conveyance mechanism. On the other hand, if the control unit 7 determines that there is no substrate on which the imprint process should be performed (NO in step S115), the processing proceeds to next step S116. In step S116, the control unit 7 causes the mold conveyance mechanism to collect the mold 8 held by the mold chuck 15 before finishing all steps.

The imprint apparatus 1 according to the first exemplary embodiment has been described with a case where the substrate-side pattern area is heated using the heating mechanism 6, but the irradiation unit 2 may also be used. In that case, the irradiation unit 2 irradiates the substrate-side pattern area with, among light beams emitted from the light source of the irradiation unit 2, light of a wavelength band in which the imprint material is not cured. Thus, the irradiation unit 2 includes an optical filter that transmits light of an arbitrary wavelength band so that the light can be switched in such a way that light in a wavelength band in which the imprint material is cured is emitted during a curing process and light in a wavelength band in which the imprint material is not cured is emitted when the substrate is heated. Thus, with an optical filter included in the irradiation unit 2, the wavelength of light that irradiates the substrate 11 can be used for different purposes.

Also, the imprint apparatus 1 according to the first exemplary embodiment has been described with a case where the number of the pattern portions 8a formed on the mold 8 is one, but a plurality of the pattern portions 8a may be formed on the mold 8. When patterns of the imprint material are formed in a plurality of substrate-side pattern areas using the mold 8 on which the plurality of pattern portions 8a is formed, each of the plurality of substrate-side pattern areas can thermally be deformed by the heating mechanism 6 described above. Forming patterns using the mold 8 on which the plurality of pattern portions 8a is formed may be called a multi-area imprint or multi-field imprint. If the heating mechanism 6 irradiates the plurality of substrate-side pattern areas using a single DMD, the illuminance of light with which one substrate-side pattern area is irradiated decreases so that the thermal deformation amount is limited. Therefore, by separately irradiating the substrate-side pattern area like the heating mechanism 6 described in the first exemplary embodiment, the illuminance of light with which the substrate-side pattern area is irradiated can be increased without increasing output power of the heating light source 62.

The imprint apparatus 1 on which the heating mechanism 6 is mounted as in the first exemplary embodiment can illuminate an arbitrary substrate-side pattern area, obtained by dividing the substrate-side pattern area, by using a plurality of DMDs.

Figure 7:
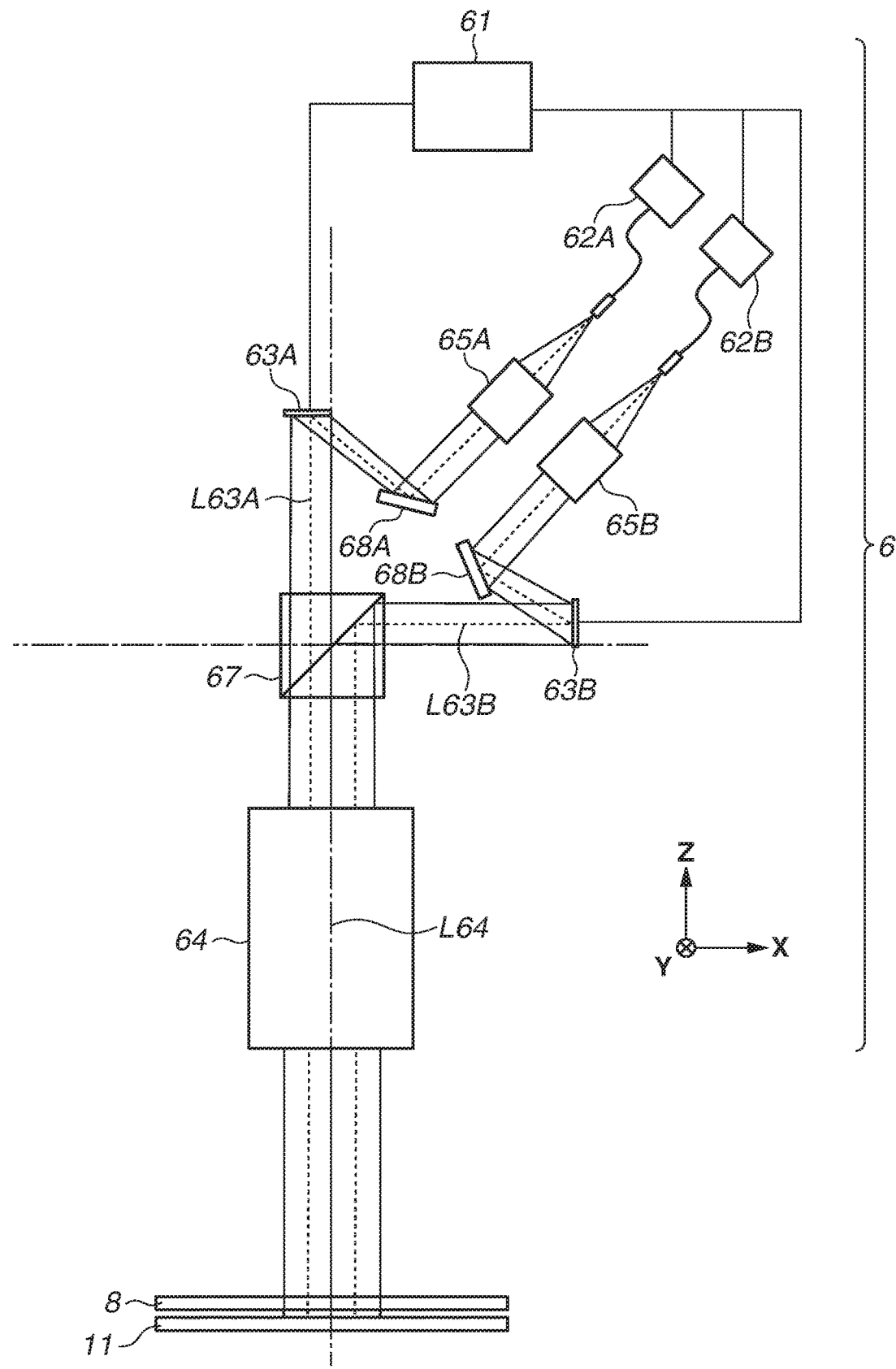
FIG. 7 is a diagram illustrating a heating mechanism according to a second exemplary embodiment.

Next, a heating mechanism 6 according to a second exemplary embodiment will be described with reference to FIG. 7. FIG. 7 is a diagram illustrating the configuration of the heating mechanism 6 according to the second exemplary embodiment. An imprint apparatus using the heating mechanism 6 according to the second exemplary embodiment basically operates in the same manner as the imprint apparatus 1 according to the first exemplary embodiment or has the same imprint process as the first exemplary embodiment and thus, only a different configuration will be described.

In the first exemplary embodiment, the optical axis L63A and the optical axis L63B of light beams reflected by the respective DMDs 63 (63A, 63B) are shifted with respect to the optical axis L64 of the projection optical system 64 for illumination. Also, the heating mechanism 6 according to the first exemplary embodiment illuminates the substrate-side pattern area with light beams from the two heaters A and B next to each other by tilting the optical axis L63A and the optical axis L63B with respect to the optical axis L64 of the projection optical system 64 for illumination.

If at least one of the wavelength and the polarization direction of light beams emitted from the heating light source 62A and the heating light source 62B is made different, the heating mechanism 6 according to the second exemplary embodiment is set such that the optical axis L63A of light reflected by the DMD 63A is shifted. The heating mechanism 6 according to the second exemplary embodiment is characterized in that light beams from the heater A and the heater B are combined using a beam splitter 67. Accordingly, the heating mechanism 6 can illuminate the substrate-side pattern area with light beams emitted from the heater A and the heater B next to each other.

First, there will be described a case where the optical axis L63A and the optical axis L63B of light reflected by the DMDs 63 are shifted with respect to the optical axis L64 of the projection optical system 64 and the wavelengths of light beams emitted from the two heating light sources 62A and 62B are different. Like the heating mechanism according to the first exemplary embodiment, the heating mechanism 6 illustrated in FIG. 7 includes the dose control apparatus 61, the heating light source 62, the DMD 63, the projection optical system 64, and the irradiation optical system 65. In addition, the heating mechanism according to the second exemplary embodiment includes the beam splitter 67 and a mirror 68.

Light emitted from the heating light source 62A enters the irradiation optical system 65A. The light emitted from the irradiation optical system 65A is reflected by a mirror 68A to uniformly illuminate the DMD 63A. A dielectric multi-layer mirror or the like is used for the mirror 68 (68A, 68B), which has a high reflectance for the wavelength of light emitted from the heating light source 62A and the incident angle of light from the irradiation optical system 65. The DMD 63A uniformly illuminated by the light reflected by the mirror 68A is disposed while being shifted by a predetermined amount with respect to the optical axis L64 of the projection optical system 64. For example, it is assumed that half (26×16.5 mm) of the pattern area (for example, 26×33 mm) on the substrate 11 is illuminated by the heater A and the imaging magnification of the projection optical system 64 is −3. In this case, an emission optical axis L63A of the DMD 63A is shifted in a −X direction illustrated in FIG. 7 by 5.5 mm. Light reflected by the micro-mirror in the ON state of the DMD 63A enters the beam splitter 67. The beam splitter 67 has a function of transmitting one of two light beams with different wavelengths and reflecting the other. In the present exemplary embodiment illustrated in FIG. 7, light emitted from the DMD 63A passes through the beam splitter 67 while light emitted from the DMD 63B is reflected by the beam splitter 67. The light beams transmitted and reflected by the beam splitter 67 enter the single projection optical system 64 to separately illuminate a pattern area on the substrate 11 next to each other.

Figure 8:
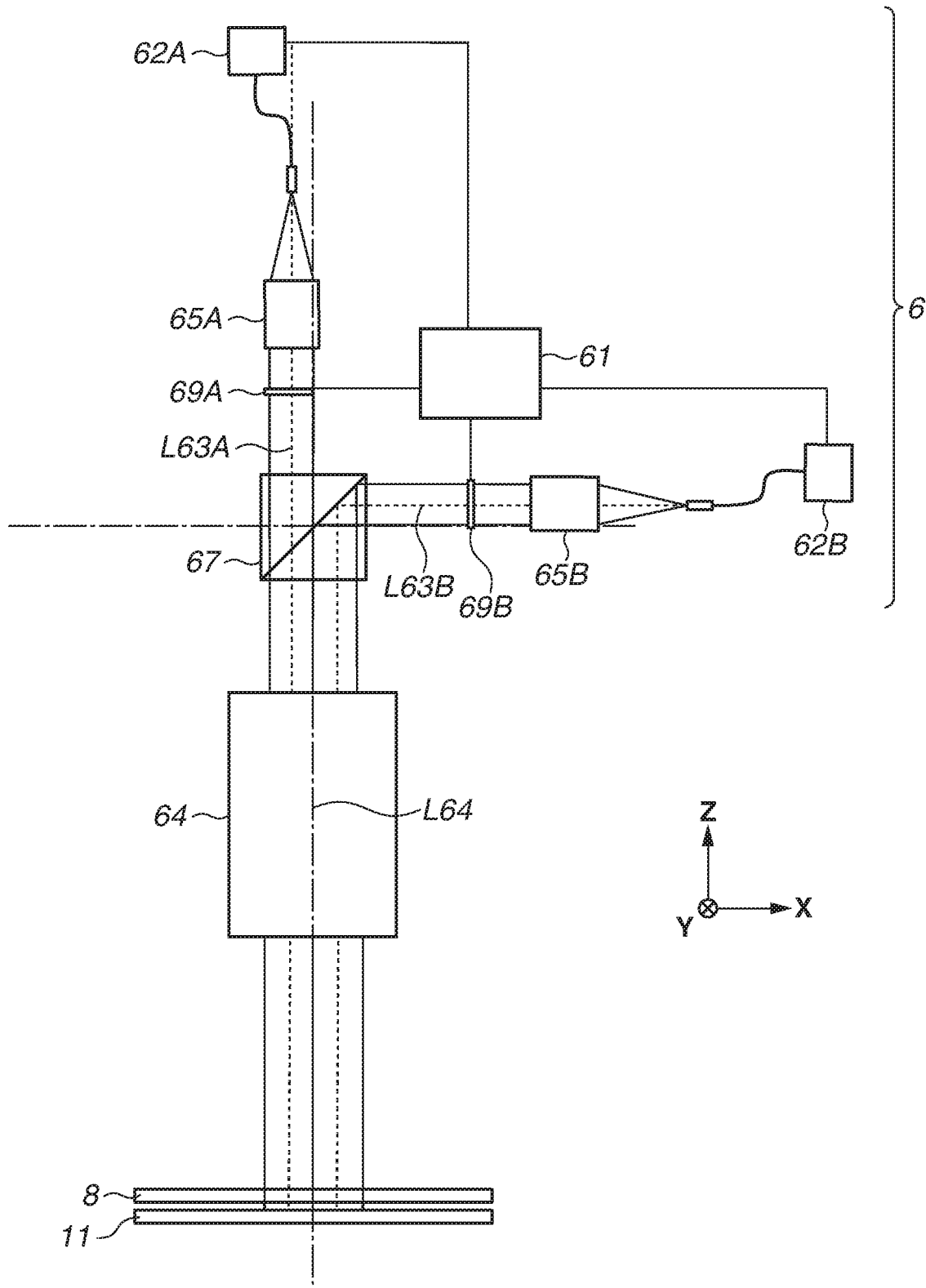
FIG. 8 is a diagram illustrating a heating mechanism according to a third exemplary embodiment.

The heating mechanisms 6 according to the above exemplary embodiments have been described with a case where the DMD 63 is used as an optical modulator. A heating mechanism 6 according to a third exemplary embodiment uses a liquid crystal device 69 as an optical modulator (illuminance distribution forming unit). FIG. 8 illustrates a schematic diagram of the heating mechanism 6 when the optical modulator is the liquid crystal device 69 of transmission type. Light emitted from the heating light source 62A enters the irradiation optical system 65A. Light emitted from the irradiation optical system 65A uniformly illuminates a liquid crystal device 69A. The transmittance of the liquid crystal device 69A is controlled by the dose control apparatus 61 to form a target illuminance distribution in the pattern area on the substrate 11. Light having passed through the liquid crystal device 69A passes through the beam splitter 67 to separately illuminate the pattern area on the substrate 11 next to each other.

Similarly, light emitted from the heating light source 62B enters the irradiation optical system 65B. Light emitted from the irradiation optical system 65B uniformly illuminates a liquid crystal device 69B. The transmittance of the liquid crystal device 69B is controlled by the dose control apparatus 61 to form a target illuminance distribution in the pattern area on the substrate 11. Light having passed through the liquid crystal device 69B is reflected by the beam splitter 67 to separately illuminate the pattern area on the substrate 11 next to each other.

The third exemplary embodiment has been described with a case where the optical axis L63 (L63A, L63B) of light having passed through the liquid crystal device 69 is shifted with respect to the optical axis of the projection optical system 64 and the wavelengths of light beams emitted from the two heating light sources 62A and 62B are made different. However, the aspect of the embodiments is not limited to such an example. The position of illumination light in the pattern area can be adjusted and separately illuminated by tilting the optical axis L63 of light having passed through the liquid crystal device 69 with respect to the optical axis of the projection optical system 64 by the method described in the first exemplary embodiment.

When polarized light beams emitted from the two heating light sources 62A and 62B are made different (for example, S-polarized light is emitted from the heating light source 62A and P-polarized light is emitted from the heating light source 62B), a polarization beam splitter is used as the beam splitter 67. In the third exemplary embodiment illustrated in FIG. 8, the beam splitter 67 is set to transmit the S-polarized light and to reflect the P-polarized light. A polarization plate may be disposed on an optical path to improve the transmittance and the reflectance of the beam splitter 67.

With an imprint apparatus on which the heating mechanism 6 is mounted as described above, the imprint apparatus 1 for increasing power of the heating light source can be provided using a plurality of optical modulators to separately illuminate the pattern area of the substrate 11 divided into a plurality of areas.

Figure 9:
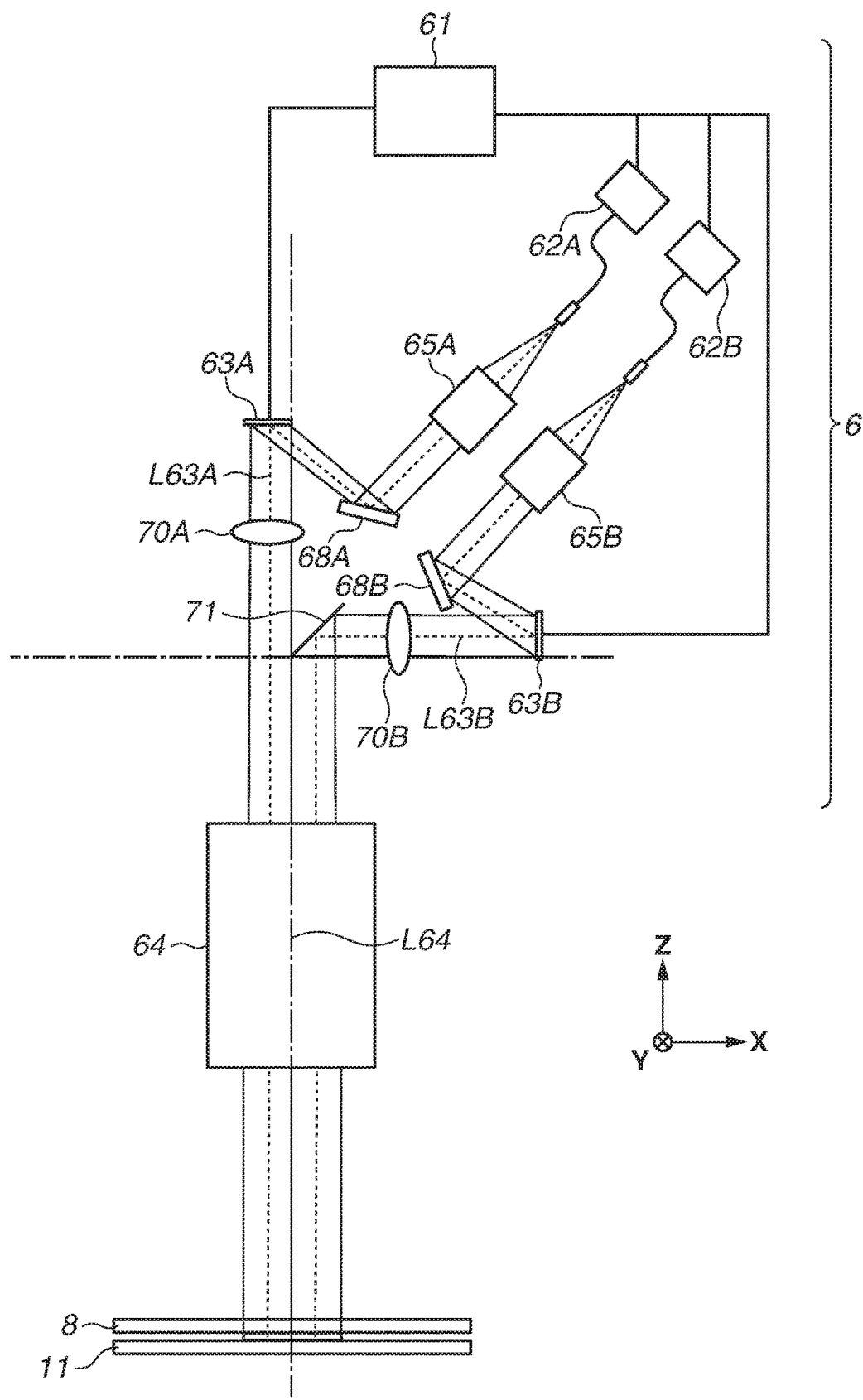
FIG. 9 is a diagram illustrating a heating mechanism according to a fourth exemplary embodiment.

Next, a heating mechanism 6 according to a fourth exemplary embodiment will be described with reference to FIG. 9. FIG. 9 is a diagram illustrating the configuration of the heating mechanism 6 according to the fourth exemplary embodiment. An imprint apparatus using the heating mechanism 6 according to the fourth exemplary embodiment basically operates in the same manner as the imprint apparatus 1 according to the first exemplary embodiment or the second exemplary embodiment or has the same imprint process as the first exemplary embodiment or the second exemplary embodiment and thus, only a different configuration will be described here.

In the second exemplary embodiment, when at least one of the wavelength and the polarization direction of light beams emitted from the heating light sources 62A and 62B of two heaters are made different, illumination light beams are combined using the beam splitter 67. In the fourth exemplary embodiment, the pattern area is separately illuminated next to each other using a knife-edge mirror without depending on the wavelength and the polarization direction of light beams emitted from the heating light sources 62A and 62B of two heaters. Accordingly, the heating mechanism 6 can illuminate the substrate-side pattern area with emission light beams from the heater A and the heater B next to each other.

The heating mechanism 6 illustrated in FIG. 9 includes an image-forming optical system 70 and a knife-edge mirror 71 in addition to the dose control apparatus 61, the heating light source 62, the DMD 63, the projection optical system 64, the irradiation optical system 65, and the mirror 68.

Each of the DMDs 63A and 63B has micro-mirrors arranged two-dimensionally therein and has a function as a diffraction grating. Thus, light emitted from the DMD 63 is diffracted and broadens. To reflect light from the DMD 63B efficiently by the knife-edge mirror 71 without blocking light from the DMD 63A, an image near the knife-edge mirror 71 is formed. Thus, the image-forming optical system 70 has a function of creating a substantially optically conjugate relationship between the DMD 63 and the knife-edge mirror 71. Accordingly, light modulated by the DMD 63A forms an image near the knife-edge mirror 71 by an image-forming optical system 70A and enters the projection optical system 64 without being blocked. Meanwhile, light modulated by the DMD 63B forms an image near the knife-edge mirror 71 by an image-forming optical system 70B and is reflected before entering the projection optical system 64. Accordingly, the heaters can separately illuminate the pattern area on the substrate 11 next to each other.

With an imprint apparatus on which a heating mechanism is mounted as described above, the imprint apparatus 1 for increasing power of the heating light source can be provided using a plurality of optical modulators to separately illuminate the pattern area on the substrate 11.

The heating light source 62 in the heating mechanism 6 according to any of the above exemplary embodiments has been described with a case where the plurality of heating light sources 62A and 62B is included, but the number of the heating light sources 62 may be one. In that case, light emitted from one heating light source is split (separated) by an optical element so that a plurality of optical modulators is irradiated therewith. For example, a beam splitter is used as an optical element that splits light emitted from the heating light source 62.

The plurality of optical modulators (DMDs 63A, 63B) in the heating mechanism 6 according to any of the above exemplary embodiments separately illuminates the pattern area on the substrate 11 next to each other. However, each of the plurality of optical modulators may illuminate the pattern area on the substrate 11, without dividing the pattern area into a plurality of areas, for overlay illumination with light beams from the plurality of optical modulators. When the plurality of optical modulators is used, the dose of light emitted from each optical modulator decreases and thus degradation of the optical modulators can be reduced, as compared with a case where only one optical modulator is used for illumination.

Further, the heating mechanism 6 included in the imprint apparatus 1 has been described in all of the above exemplary embodiments, but the disclosure is not limited to such an example. For example, the aspect of the embodiments is also effective for an optical pattern formation apparatus that forms an effective light source distribution of an exposure apparatus using an optical modulator. Here, the exposure apparatus is an apparatus that illuminates a pattern formed on a reticle (original) to expose a substrate to light from the reticle via a projection optical system. A method for illumination by the exposure apparatus is known in which light from a light source has a distribution at the time of illuminating a reticle. An effective light source distribution of light from the light source is formed by the optical modulator (DMD) included in the optical pattern formation apparatus. Thus, the optical pattern formation apparatus can also form, like the heating mechanism 6 described in the above exemplary embodiments, an effective light source distribution using a plurality of optical modulators. Accordingly, degradation of functionality of the optical modulator included in the optical pattern formation apparatus can be suppressed.

(Method for Manufacturing Article)

Next, a method for manufacturing an article using an imprint apparatus including the above heating mechanism will be described. For example, in a case where a semiconductor device is an article to be manufactured, the semiconductor device is manufactured by undergoing a front-end process in which an integrated circuit is formed on a substrate and a back-end process in which an integrated circuit chip on the substrate formed in the front-end process is finished as a product. The front-end process includes a process for forming a pattern on an imprint material on the substrate using the imprint apparatus. The back-end process includes an assembly process (dicing, bonding) and a packaging process (encapsulation). According to the method for manufacturing a semiconductor device in the present exemplary embodiment, semiconductor devices can be manufactured as higher-quality articles than in the past.

Patterns of a cured substance formed using the imprint apparatus are used permanently for at least a portion of various articles or temporarily when various articles are manufactured. Articles include electric circuit devices, optical elements, microelectromechanical systems (MEMS), recording devices, sensors, and molds. Examples of electric circuit devices include volatile or nonvolatile semiconductor memories such as a dynamic random access memory (DRAM), a static random access memory (SRAM), a flash memory, and a magnetoresistive random access memory (MRAM), and semiconductor devices such as a large-scale integrated (LSI) circuit, a charge-coupled device (CCD), an image sensor, and a field programmable gate array (FPGA). Examples of molds include a mold for imprinting.

Patterns of a cured substance are used as they are as at least a portion of components of the above articles or temporarily as a resist mask. In a manufacturing process of a substrate, the resist mask is removed after etching or ion implantation is performed.

Figure 10A:
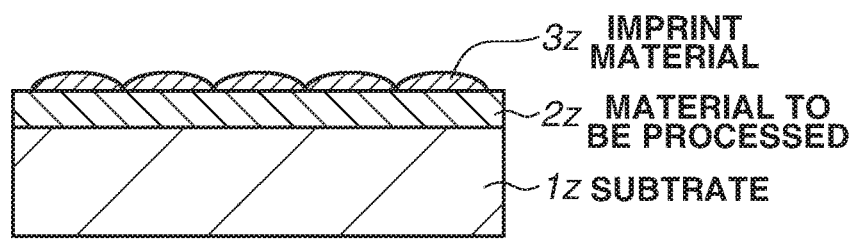
FIGS. 10A, 10B, 10C, 10D, 10E, and 10F are diagrams illustrating a method for manufacturing an article.

Next, a specific method for manufacturing an article will be described. As illustrated in FIG. 10A, a substrate 1z such as a silicon wafer is prepared. A material to be processed 2z such as an insulating material is formed on a surface of the substrate 1z. Subsequently, an imprint material 3z is applied to a surface of the material to be processed 2z by an ink jet method or the like. Here, a state in which the imprint material 3z in the form of a plurality of droplets is provided above the substrate 1z is illustrated.

Figure 10B:
Figure 10C:
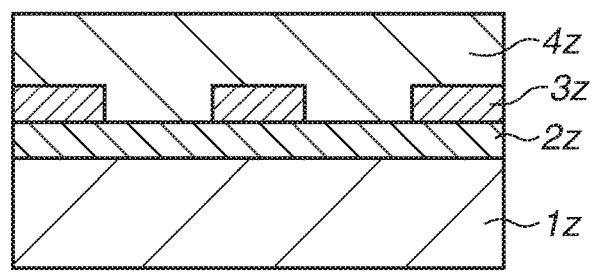

As illustrated in FIG. 10B, a mold 4z for imprinting is made to oppose the imprint material 3z above the substrate 1z. A side of the mold 4z on which a concave-convex pattern is formed is directed to the imprint material 3z. As illustrated in FIG. 10C, the substrate 1z to which the imprint material 3z is applied and the mold 4z are brought into contact and a pressure is applied thereto. A gap between the mold 4z and the material to be processed 2z is filled with the imprint material 3z. If the imprint material 3z is irradiated with light, as energy for curing, in this state through the mold 4z, the imprint material 3z is cured.

Figure 10D:
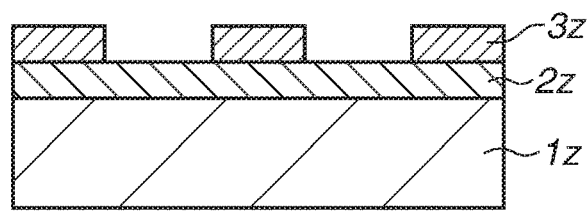

As illustrated in FIG. 10D, after the imprint material 3z is cured, the mold 4z and the substrate 1z are separated to form a pattern of a cured substance of the imprint material 3z above the substrate 1z. The pattern of the cured substance has a shape in which a concave portion of the mold corresponds to a convex portion of the cured substance and a convex portion of the mold corresponds to a concave portion of the cured substance and thus, a concave-convex pattern of the mold 4z is transferred to the imprint material 3z.

Figure 10E:
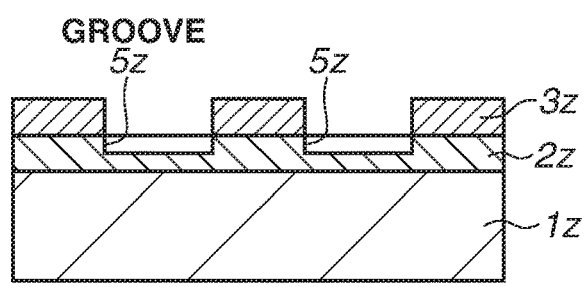
Figure 10F:
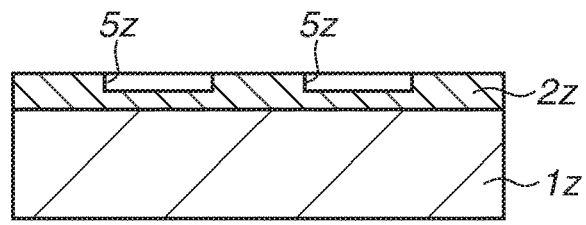

As illustrated in FIG. 10E, when etching is performed using the pattern of the cured substance as an etching resistant mask, the surface of the material to be processed 2z where there is no cured substance or where there is a thin residual film of the cured substance is removed to form a groove 5z. As illustrated in FIG. 10F, when the pattern of the cured substance is removed, an article with the groove 5z formed on the surface of the material to be processed 2z can be obtained. Here, the pattern of the cured substance is removed, but may also be used as, for example, a film for interlayer insulation contained in semiconductor devices, that is, as a constituent member of articles without being removed after processing.

In the foregoing, the exemplary embodiments of the disclosure have been described, but the disclosure is not limited to the above exemplary embodiments and can be modified or altered in various ways within the scope thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-233247, filed Nov. 30, 2016, which is hereby incorporated by reference herein in its entirety.

What is claimed is:

1. An apparatus configured to form a pattern of an imprint material in a shot area of a substrate using a mold, the apparatus comprising:

a heating mechanism configured to change a shape of the substrate by irradiating the shot area with light having a wavelength in a wavelength band where the imprint material is not cured; and an irradiation unit configured to emit light to cure the imprint material, wherein the heating mechanism includes a plurality of optical modulators, the plurality of optical modulators each being either a digital micro-mirror device or a liquid crystal display, configured to form an illuminance distribution in the shot area, and light beams from the plurality of optical modulators illuminate mutually different areas of the shot area.

2. The apparatus according to claim 1, further comprising a projection optical system configured to guide the light from the heating mechanism to the substrate, wherein the shot area is irradiated with each of the light beams from the plurality of optical modulators via the projection optical system.

3. The apparatus according to claim 2, wherein the heating mechanism decenters an optical axis along which the light from the optical modulator enters the projection optical system with respect to an optical axis of the projection optical system.

4. The apparatus according to claim 2, wherein the heating mechanism tilts an optical axis along which the light from the optical modulator enters the projection optical system with respect to an optical axis of the projection optical system.

5. The apparatus according to claim 4, wherein each of the optical modulators includes a plurality of operating micro-mirrors, and wherein the optical axis along which the light from the optical modulator enters the projection optical system is decentered from the optical axis of the projection optical system by changing an operating area of the plurality of micro-mirrors included in the optical modulator.

6. The apparatus according to claim 1, wherein the heating mechanism separately irradiates each of a plurality of areas of the shot area with light.

7. The apparatus according to claim 1, further comprising a combining unit configured to combine the light beams from the plurality of optical modulators, wherein the combined light beams illuminate the shot area.

8. The apparatus according to claim 7, wherein the heating mechanism includes a light source configured to irradiate the plurality of optical modulators with light beams of different wavelengths, and wherein the combining unit is a beam splitter configured to combine the light beams of different wavelengths from the plurality of optical modulators.

9. The apparatus according to claim 7, wherein the heating mechanism includes a light source configured to irradiate the plurality of optical modulators with light beams of different polarization directions, and wherein the combining unit is a beam splitter configured to combine the light beams of different polarization directions from the plurality of optical modulators.

10. The apparatus according to claim 1, wherein the projection optical system creates a conjugate relationship between each of the plurality of optical modulators and the substrate.

11. The apparatus according to claim 1, wherein the heating mechanism includes:

a plurality of heating light sources configured to irradiate the shot area with light beams; and a plurality of irradiation optical systems configured to irradiate the plurality of optical modulators with the respective light beams from the plurality of heating light sources.

12. An apparatus configured to form a pattern of an imprint material in a shot area of a substrate using a mold, the apparatus comprising:

a heating mechanism configured to change a shape of the substrate by irradiating the shot area with light, wherein the heating mechanism includes:

a plurality of optical modulators, the plurality of optical modulators each being either a digital micro-mirror device or a liquid crystal display, configured to form an illuminance distribution in the shot area, and light beams from the plurality of optical modulators illuminate mutually different areas of the shot area;

a heating light source configured to irradiate the plurality of optical modulators with light;

an optical element configured to split the light from the heating light source such that the plurality of optical modulators is irradiated with the light; and an irradiation optical system configured to irradiate the plurality of optical modulators with the light after being split.

13. An apparatus configured to form a pattern of an imprint material in a shot area of a substrate using a mold, the apparatus comprising:

a heating mechanism configured to change a shape of the substrate by irradiating the shot area with light having a wavelength in a wavelength band where the imprint material is not cured, and an irradiation unit configured to emit light to cure the imprint material, wherein the heating mechanism includes a plurality of optical modulators, the plurality of optical modulators each being either a digital micro-mirror device or a liquid crystal display, configured to form an illuminance distribution in the shot area, and light beams from the plurality of optical modulators each illuminate the same area of the shot area.

* * * * *